(12) United States Patent
Wei et al.

(10) Patent No.: US 9,040,400 B2
(45) Date of Patent: May 26, 2015

(54) AIR-STABLE N-CHANNEL ORGANIC ELECTRONIC DEVICES

(75) Inventors: Peng Wei, Stanford, CA (US); Zhenan Bao, Stanford, CA (US); Joon Hak Oh, Irvine, CA (US)

(73) Assignee: The Board of Trustees of the Leland Stanford Junior University

( * ) Notice: Subject to any disclaimer, the term of this patent is extended or adjusted under 35 U.S.C. 154(b) by 528 days.

(21) Appl. No.: 13/079,879

(22) Filed: Apr. 5, 2011

(65) Prior Publication Data

US 2011/0248267 A1   Oct. 13, 2011

Related U.S. Application Data

(60) Provisional application No. 61/321,035, filed on Apr. 5, 2010.

(51) Int. Cl.
| | | |
|---|---|---|
| H01L 21/22 | (2006.01) | |
| H01L 21/38 | (2006.01) | |
| H01L 51/00 | (2006.01) | |
| B82Y 10/00 | (2011.01) | |
| H01L 51/05 | (2006.01) | |

(52) U.S. Cl.
CPC ............ *H01L 51/002* (2013.01); *B82Y 10/00* (2013.01); *H01L 51/0047* (2013.01); *H01L 51/0094* (2013.01); *H01L 51/0525* (2013.01); *H01L 51/0545* (2013.01)

(58) Field of Classification Search
USPC ............... 438/47, 542; 257/40, 57, 291, 440, 257/E21.135, E29.003, E27.133, E51.018, 257/E51.006, E51.024
See application file for complete search history.

(56) References Cited

U.S. PATENT DOCUMENTS

| | | | |
|---|---|---|---|
| 2005/0176970 A1* | 8/2005 | Marks et al. .................... 549/41 |
| 2007/0018154 A1 | 1/2007 | Bae et al. | |
| 2008/0035965 A1* | 2/2008 | Hayashi et al. ............... 257/291 |
| 2008/0283826 A1 | 11/2008 | Zheng et al. | |
| 2010/0065833 A1* | 3/2010 | Huang et al. .................... 257/40 |
| 2010/0133523 A1* | 6/2010 | Nowatari et al. ............... 257/40 |
| 2010/0187515 A1 | 7/2010 | Limmert et al. | |
| 2011/0042656 A1* | 2/2011 | Burroughes et al. ............ 257/40 |
| 2011/0240980 A1 | 10/2011 | Wei et al. | |

OTHER PUBLICATIONS

Air stable and low temperature evaporable Li3N as a n type dopant in organic light-emitting diodes Kyoung Soo Yooka, Soon Ok Jeona, Chul Woong Jooa, Jun Yeob Leea, Tae-Woo Leeb, Taeyong Nohb, c, Haa-Jin Yangb, c, Sung-Kee Kangb, c Received Mar. 30, 2009, Accepted May 2, 2009, Available online May 31, 2009.*

(Continued)

*Primary Examiner* — Julio J Maldonado
*Assistant Examiner* — Abdulfattah Mustapha
(74) *Attorney, Agent, or Firm* — Crawford Maunu PLLC

(57) ABSTRACT

In connection with various example embodiments, an organic electronic device is provided with an organic material that is susceptible to decreased mobility due to the trapping of electron charge carriers in response to exposure to air. The organic material is doped with an n-type dopant that, when combined with the organic material, effects air stability for the doped organic material (e.g., exhibits a mobility that facilitates stable operation in air, such as may be similar to operation in inert environments). Other embodiments are directed to organic electronic devices n-doped and exhibiting such air stability.

22 Claims, 10 Drawing Sheets

(56) References Cited

OTHER PUBLICATIONS

C. Chan et al. "Molecular n-type Doping of 1,4,5,8-naphthalene tetracarboxylic dianhydride by Pyronin B Studied Using Direct and Inverse Photoelectron Spectroscopies," Adv. Funct. Mater. 16, 831-837 (2006). Abstract only.

K. Walzer et al. "Highly efficient organic devices based on electrically doped transport layers." Chem. Rev. 107, 1233-1271 (2007). Abstract/Table of Contents only.

D. Tanner and J. J. Chen. "On the Mechanism of the Reduction of Alpha-halo Ketones by 1,3-dimethyl-2-phenylbenzimidazoline-reduction by a Set-hydrogen Atom Abstraction Chain Mechanism." J. Org. Chem. 54, 3842-3846 (1989). p. 3842 only.

J. H. Oh et al. "Molecular n-type doping for air-stable electron transport in vacuum-processed n-channel organic transistors." Applied Physics Letters 97, 243305 (Dec. 2010).

P. Wei et al. "Use of a 1$H$-Benzoimidazole Derivative as an $n$-Type Dopant and to Enable Air-Stable Solution-Processed $n$-Channel Organic Thin-Film Transistors." J. Am. Chem. Society 132(26), 8852-8853 (Jun. 2010). Abstract only.

S. Reineke et al. "White organic light-emitting diodes with fluorescent tube efficiency." Nature 459, 234 (May 2009).

J. Liu et al. "Efficient bottom cathodes for organic light-emitting devices." App. Phys. Lett. 85(5), 837 (2004). Abstract only.

S. Tanaka et al. "Doping Effect of Tetrathianaphthacene Molecule in Organic Semiconductors on Their Interfacial Electronic Structures Studied by UV Photoemission Spectroscopy." Jpn. J. Appl. Phys. 44(6a) 3760 (2005).

C. Chan et al. "N-type doping of an electron-transport material by controlled gas-phase incorporation of cobaltocene." Chem. Phys. Lett. 431, 67 (Sep. 2006).

A. Werner et al. "n-Type Doping of Organic Thin Films Using Cationic Dyes." Adv. Funct. Materials 14(3), 255 (Mar. 2004). Abstract only.

F. Li et al. "Leuco Crystal Violet as a Dopant for n-Doping of Organic Thin Films of Fullerene C60." J. Phy. Chem. B 108(44), 17076-17082 (Oct. 2004). Abstract only.

X.Q. Zhu et al. "Hydride, Hydrogen Atom, Proton, and Electron Transfer Driving Forces of Various Five-Membered Heterocyclic Organic Hydrides." J. Am. Chem. Soc. 130(8), 2501-2516 (Feb. 2008). Abstract only.

\* cited by examiner

AIR-STABLE N-CHANNEL ORGANIC ELECTRONIC DEVICES

RELATED PATENT DOCUMENT

This patent document claims the benefit, under 35 U.S.C. §119(e), of U.S. Provisional Patent Application Serial No. 61/321,035 filed on Apr. 5, 2010, and entitled "Air-Stable n-Channel Organic Electronic Devices;" this patent document is fully incorporated herein by reference.

FEDERALLY-SPONSORED RESEARCH AND DEVELOPMENT

This invention was made with Government support under contract FA9550-09-1-0256 awarded by the Air Force Office of Scientific Research. The U.S. Government has certain rights in this invention.

FIELD

The present invention relates generally to organic electronics, and more specifically, to doped organic electronic devices and related methods.

BACKGROUND

Organic electronic devices, such as organic thin-film transistors (OTFTs) and other organic semiconductors (OSCs) have attracted a great deal of attention because of their potential applications in low-cost, large-area and flexible electronics. Organic semiconductors are commonly referred to as either p-channel (hole-transporting) or n-channel (electron-transporting) depending on which type of charge carrier is dominant for the charge transport.

While p-channel organic semiconductors have been readily implemented for a variety of applications, n-channel organic semiconductors have been challenging to manufacture and implement. Generally, the energetically high-lying lowest unoccupied molecular orbital (LUMO) levels in most organic semiconductors hinder the efficient injection of electrons. In n-channel OTFTs, electrons can be transferred from the high-lying highest occupied molecular orbitals (HOMOs) of dopants to the LUMOs of organic semiconductors by n-type doping. However, such dopants are susceptible to oxidation. Electron charge carriers are vulnerable to trapping, either by traps at the interface of dielectric-semiconductor materials, which may involve hydroxyl groups or ambient oxidants, such as $O_2$ and $H_2O$. Such charge-trapping can decrease the density of mobile electron charge carriers, degrade the mobility, and increase the threshold voltage for n-channel OTFTs.

While various n-type dopants have been used to dope organic semiconductors, they have been challenging to implement. For example, alkali metals are prone to diffuse through organic layers due to their relatively small atomic radii, leading to device instability. In addition, alkali metals are difficult to process. Other dopants having both extremely high-lying HOMO levels and exhibiting air stability do not provide donors that are strong enough to obtain sufficient n-channel mobility and/or conductivity. Cationic dyes have been used as stable precursors for strong molecular donors, but have been relatively limited due to the lack of available compounds having a strong n-type doping effect.

These and other issues remain as a challenge to a variety of methods, devices and systems that use or benefit from organic electronic devices, such as organic thin-film transistors, organic light-emitting diodes (OLEDs), and organic photovoltaics (OPVs).

SUMMARY

Various aspects of the present invention are directed to devices, methods and systems involving doped organic electronic devices, which address challenges including those discussed above.

According to an example embodiment, an organic electronic device is manufactured as follows. An organic material is provided, the material being susceptible to decreased mobility due to electron charge trapping in response to exposure to air. The organic material is doped with an n-type dopant that, when combined with the organic material via doping, effects air stability for the doped organic material.

Another example embodiment is directed to a method for manufacturing an organic semiconductor device. An organic semiconductor material having a LUMO level that is at least about −4.1 eV is provided, the organic semiconductor material being susceptible to decreased mobility due to electron charge trapping in response to exposure to air. An n-type dopant is selected, which effects air stability in the organic semiconductor material when doped therein. These respective organic semiconductor and n-type dopant materials have respective electron affinity and ionization potential values that exhibit an energetic barrier to doping of the organic semiconductor material. A field is applied to the organic material to generate negative charge carriers in the organic semiconductor material to overcome the energetic barrier and facilitate doping of the organic semiconductor material with the n-type dopant.

Another example embodiment is directed to an organic electronic device. The device includes an organic material that is susceptible to decreased mobility due to electron charge trapping in response to exposure to air. An n-type dopant is in the organic material, the n-type dopant effecting air stability for the doped organic material, as combined with the organic material (via doping).

The above summary is not intended to describe each embodiment or every implementation of the present disclosure. The figures and detailed description that follow more particularly exemplify various embodiments.

BRIEF DESCRIPTION OF THE DRAWINGS

Aspects of the invention may be more completely understood in consideration of the following detailed description of various embodiments of the invention in connection with the accompanying drawings, in which.

Figure 1:
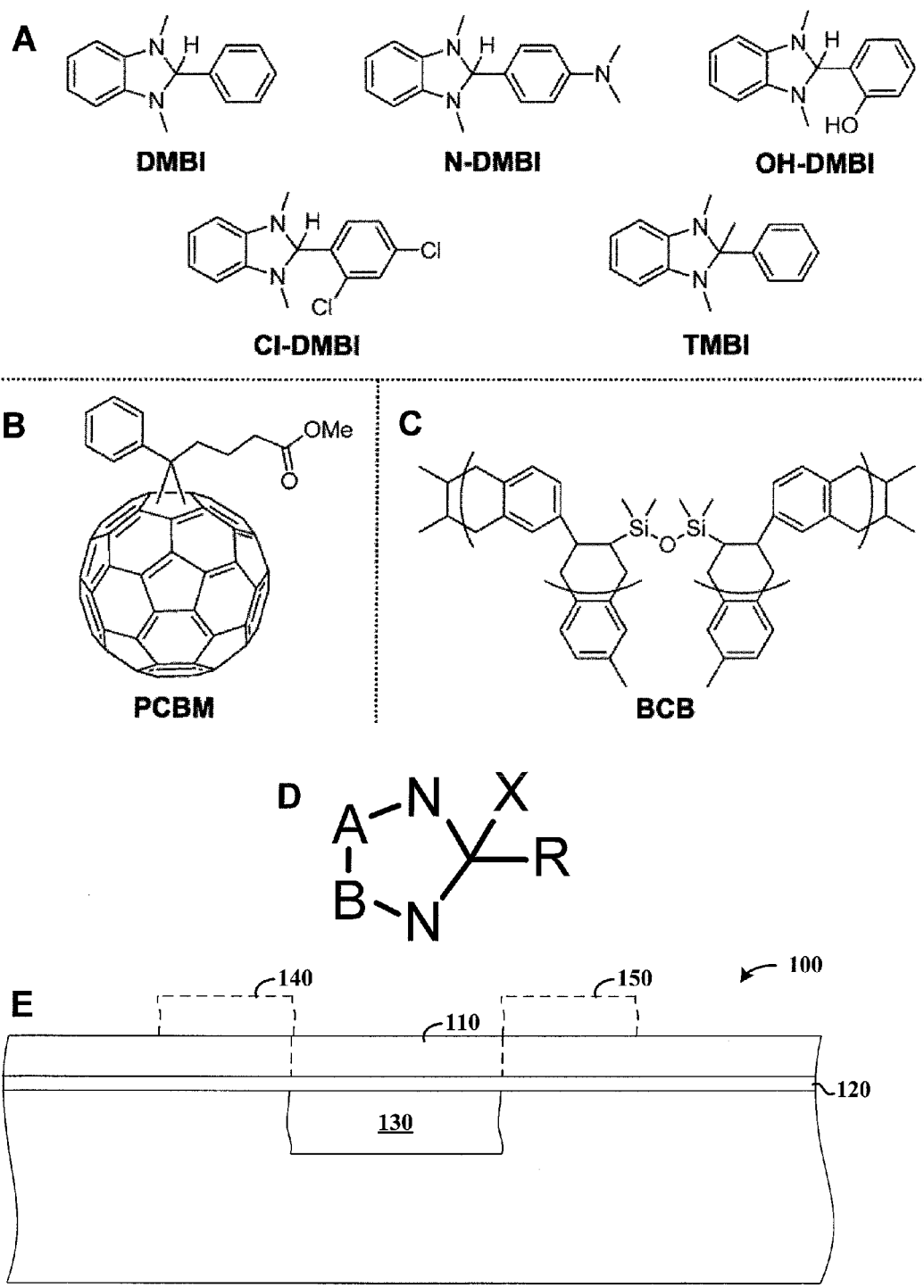
FIG. 1 shows an organic semiconductor device and various materials used therein, according to an example embodiment of the present invention.

While aspects of the invention are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

DETAILED DESCRIPTION

The present invention relates to organic electronic devices and methods for making such devices, as described herein. While the present invention is not necessarily limited in these contexts, various aspects of the invention may be appreciated through a discussion of examples using these and other contexts.

In connection with an example embodiment, organic materials are doped via n-type molecular doping to produce air-stable n-type organic devices, such as transistors or other electronic devices. A dopant/organic semiconductor combination is selected to achieve desirable mobility and stability, and used to form the doped organic material for a component (e.g., a channel region) of an organic device. For example, an organic semiconductor material may be selected to suit a particular application, and a dopant and its concentration may be subsequently selected based upon the selected type of organic semiconductor.

In some embodiments, an organic material that is inoperable or otherwise susceptible to degradation in certain environmental conditions is doped with an n-type dopant to set electrical characteristics of the organic material and further render the material amenable to the exposure to air, oxygen or other environmental conditions. Using this approach, organic materials previously employed under restricted conditions, such as in inert environments, can be rendered useful in applications in which the organic materials are exposed to air, either during or after manufacture.

The dopant is applied to the organic material using one or more of a variety of approaches. In some embodiments, a dopant is vacuum-deposited by co-evaporation. In other embodiments, the dopants are used to contact-dope the organic material, such as by solution deposition. In some applications, dopants are deposited upon an underlying substrate, and the organic material is subsequently deposited upon the dopants, which are used to dope the organic material. The dopants are used to modify the organic material to render the material resistive to oxidation or other modification upon exposure to air or other ambient conditions.

In more particular embodiments, one or both of N,N'-ditridecylperylene-3,4:9,10-tetracarboxylic acid diimide (PTCDI-C13) and N N'-dibutyl-1,7difluoroperylene-3,4:9,10-tetracarboxylic acid diimide (F-PTCDI-C4) are used as active materials in n-channel organic semiconductors. These materials exhibit excellent electron mobilities, and have LUMO levels (3.70 and −3.76 eV for PTCDI-C13 and F-PTCDI-C4, respectively) above the onset region (−3.8~− 4.0 eV) of the empirical first reduction potential window observed for air stability of arylene diimide-based n-channel organic thin film transistors (OTFTs). A cationic dye, Pyronin B (PyB), is used as an n-type dopant to dope the organic materials to form n-channel regions of an OTFT, and render the channel stable in air.

In connection with various embodiments, a rational n-type molecular doping is used to convert air-unstable organic semiconductors into air-stable active materials. In some implementations, dopant-semiconductor pairs having relatively large energetic barriers are used to create n-type doped semiconductor regions, using an applied gate field to generate negative charges and relieve energetic requirements for doping. This approach can be used to generate devices exhibiting a high $I_{on}/I_{off}$ ratio, using the doped regions (e.g., for transistor devices). One specific embodiment is directed to PyB-doped thin-film transistors (TFTs) having one or both of PTCDI-C13 and FPTCDI-C4 organic materials operated in air. The PyB doping facilitates high air-stability in these organic materials (e.g., ~50% and 70% higher, respectively) as relative to pristine TFTs without n-doping. This approach can be implemented with a multitude of air-stable n-channel organic devices such as OTFTs, utilizing a number of organic semiconductors that have shown air-unstable n-channel operation.

Organic semiconductor devices as consistent with various embodiments herein are discussed as including organic materials that are generally unstable in manufacturing and/or operational environments (e.g., in air), which are doped to provide a resulting material that is generally stable (relative to mobility/operation). In connection with various example embodiments, organic materials that are substantially unstable may include materials that are susceptible to oxidation or the formation of other impurities, such as material having a LUMO level that is at least about −4.1, −4.0 or −3.7 eV. The instability of such materials involves, for example, the response of the material to conditions such as impurity introduction or oxidation that can happen upon exposure to ambient conditions during manufacturing stages or while in-use, in which the mobility of the material drops below acceptable levels for operation. Resulting devices that are stable exhibit mobilities when manufactured and/or operated in air that are similar to related mobilities of the devices when manufactured and/or operated in an inert environment.

In connection with various example embodiments of the present invention, an organic semiconductor device includes an imidazole-based dopant material that is configured to generate radicals that dope an organic semiconductor material therein. Such a device can be used, for example, in connection with embodiments as discussed above, to facilitate the air-stability of organic devices.

In connection with other example embodiments, an organic semiconductor device is manufactured using an imidazole-based dopant material. The imidazole-based dopant material is used as a precursor, to generate radicals with high-lying energy levels. The generated radicals are then used to dope an organic semiconductor material. For general information regarding radical generation, and for specific information regarding radical generation as may be implemented in connection with one or more example embodiments, reference may be made to Chan, C. K., Kim, E. G., Bredas, J. L. & Kahn, A., "Molecular n-type Doping of 1,4,5,8-naphthalene tetracarboxylic dianhydride by Pyronin B Studied Using Direct and Inverse Photoelectron Spectroscopies," *Adv. Funct. Mater.* 16, 831-837 (2006), which is fully incorporated herein by reference.

In some embodiments, imidazole-based dopants are introduced to an organic semiconductor material to increase the charge carrier density and reduce ohmic losses in organic devices in which the organic semiconductor material is employed, facilitating desirable film conductivity and charge carrier mobility therein. The dopants can be vacuum deposited and/or solution processed to dope and set electric characteristics of the organic semiconductor (or conductor) matrix materials. The dopants are used to effect an n-type molecular doping, under relatively low-temperature conditions, and are relatively stable in air (e.g., resistant to oxidation). Electrons are transferred from the high-lying highest occupied molecular orbitals (HOMOs) of dopants to the lowest unoccupied molecular orbitals (LUMOs) of organic semiconductors via n-type doping. The density of mobile electron charge carriers in the organic semiconductor is increased to compensate for the trapped electrons by ambient oxidants, resulting in the decrease of the threshold voltages and improvement of the air stability for devices. For general information regarding organic devices, and for specific information regarding doping organic devices to increase charge carriers, reference may be made to Walzer, K., Maennig, B., Pfeiffer, M. & Leo, K., "Highly efficient organic devices based on electrically doped transport layers," *Chem. Rev.* 107, 1233-1271 (2007), cited below and fully incorporated herein by reference.

The doping effect (and strength) can be controlled using different substitution approaches to suit particular designs employing the doped organic substrates. For example, electron-donor and/or electron-acceptor group-based substitution can be carried out to suit the needs of particular applications. These approaches can be used with a variety of organic electronic devices such as organic light-emitting diodes (OLEDs), organic thin-film transistors (OTFTs), solar cells and other organic semiconductors (OSCs).

In some implementations, one or more 1,3-dimethyl-2-phenyl-2,3-dihydro-1H-benzoimidazole (DMBI) derivatives are respectively implemented to dope organic semiconductors via different types of substitution. In connection with these embodiments, it has been discovered that these DMBI derivatives exhibit a relatively strong doping effect, and can result in a significant increase in the conductivity of the organic semiconductors (e.g., increases of 3 or more orders of magnitude). For general information regarding dopant materials, and specific information regarding DMBI derivative materials and/or their application as may be implemented in connection with one or example embodiments, reference may be made to Tanner, D. D. & Chen, J. J., "On the Mechanism of the Reduction of Alpha-halo Ketones By 1,3-dimethyl-2-phenylbenzimidazoline-reduction by a Set-hydrogen Atom Abstraction Chain Mechanism," *J. Org. Chem.* 54, 3842-3846 (1989), cited below and fully incorporated herein.

In a more particular implementation, DMBI derivatives are used to dope n-channel OTFTs, and are used to compensate for the trapped electron charge carriers. Such OTFTs may include, for example, those with a solution-processable n-channel organic semiconductor, [6,6]-phenyl C61-butyric acid methyl ester (PCBM). Threshold voltages of n-channel OTFTs decrease and air stability increases, upon doping.

Turning now to the figures, FIG. 1 shows an organic semiconductor device and various materials used therein, in accordance with one or more example embodiments of the present invention. FIG. 1A shows exemplary imidazole derivatives that are used as n-type dopants, including the specific chemical structures of 1,2,3-trimethyl-2-phenyl-2,3-dihydro-1H-benzoimidazole (TMBI), and four DMBI derivatives having different substitutions including electron acceptor and donor moieties. The DMBI derivatives include DMBI,2-(2,4-dichlorophenyl)-1,3-dimethyl-2,3-dihydro-1H-benzoimidazole (Cl-DMBI);(4-(1,3-dimethyl-2,3-dihydro-1H-benzoimidazole-2-yl)-phenyl)-dimethyl-amine (N-DMBI); and 2-(1,3-dimethyl-2,3-dihydro-1H-benzoimidazol-2-yl)-phenol (OH-DMBI).

FIG. 1B shows the chemical structure of solution processable n-channel organic semiconductor PCBM, and FIG. 1C shows the chemical structure of thermally cross-linked hydroxyl-free BCB (divinyltetramethyldisiloxane bis(benzocyclobutene) used as a dielectric for the organic semiconductor. The PCBM shown in FIG. 1B exemplifies one of a multitude of different types of organic semiconductors to which various embodiments are amenable for implementation with.

FIG. 1D shows a chemical structure for an imidazole-based material, used as an n-type dopant material for doping of organic materials, in connection with one or more embodiments. The imidazole-based material includes one or more $sp^3$- or $sp^2$-hybridized carbon atoms as A and B. The symbol R represents an H atom or alkyl, aryl groups. The symbol X may be implemented using an H atom.

FIG. 1E shows an organic semiconductor device 100, having a PCBM-based organic semiconductor channel 110 doped using one or more of the imidazole derivatives shown in FIG. 1A, and having a dielectric layer 120 including a thermally crosslinked hydroxyl-free BCB type of material (e.g., on an oxide such as $SiO_2$), in accordance with one or more example embodiments. An electrode 130 is configured for applying a bias to the channel 110, via the dielectric material 120, which respectively can be used in a variety of semiconductor applications. For example, the device 100 may include source/drain regions 140/150 for implementation as an OTFT. In addition, while the device 100 is shown in a back-gate type of arrangement, the materials shown therein as well as in FIGS. 1A-1C may be implemented in a front-gated configuration as well, with the electrode 130 arranged over a dielectric and underlying channel region, the channel region being formed in or on an underlying substrate (e.g., the respective components inverted).

Figure 2:
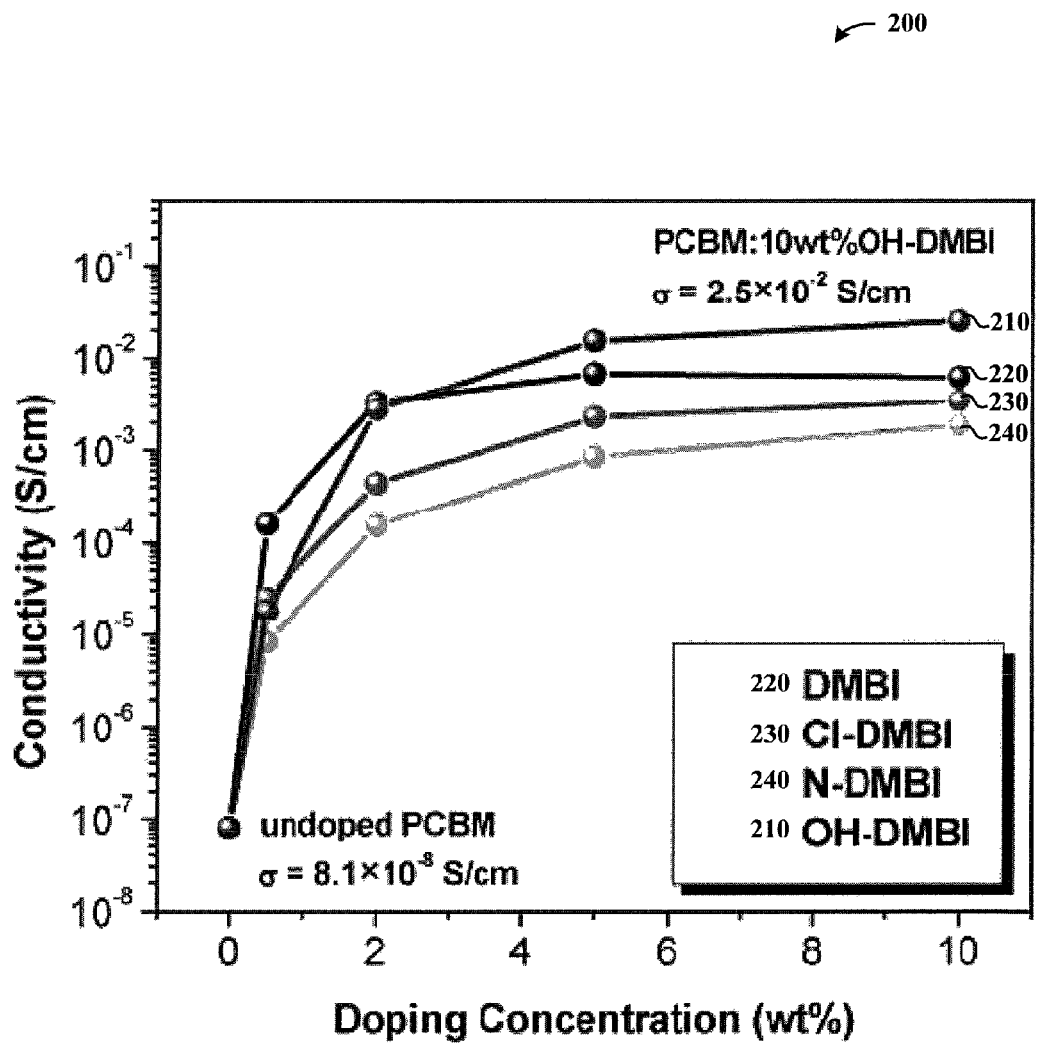
FIG. 2 shows plots of n-type doping effects of DMBI derivatives shown in FIG. 1, in accordance with other example embodiments.

FIG. 2 shows plots of n-type doping effects of the four DMBI derivatives shown in FIG. 1A, in connection with one or more example embodiments. The dopants are used to increase the respective conductivities of doped films significantly (by at least two orders of magnitude), which can be effected at a low doping concentration of about 0.5 wt % for these four DMBI derivatives. A semiconductor conductivity of about $2.5 \times 10^{-2}$ S/cm can be achieved at about 10 wt % doping of OH-DMBI on PCBM (almost six orders of magnitude higher than the undoped PCBM film). In connection with these embodiments and as exemplified in FIG. 2, it has also been discovered that the dependence of the conductivities of the resulting films upon doping concentrations is not linear. For example, at high doping concentrations (5 wt % and 10 wt % doping), the conductivities do not increase as much as the respective conductivities at lower doping concentrations (0.5 wt % and 2 wt %), and may exhibit a decrease in conductivity at certain concentrations (e.g., for 10 wt % DMBI doped PCBM film, the dopant may disturb the matrix lattice, or donated electrons may be localized (as relative to carrier transport in organic versus inorganic materials by hopping mode), resulting in decreased conductivity). As consistent with the morphology of the doping films, these DMBI dopants tend to aggregate in the films, particularly at relatively high doping concentrations, so that this strong n-type doping effect cannot extend and then delocalize to the whole doped films.

Figure 3:
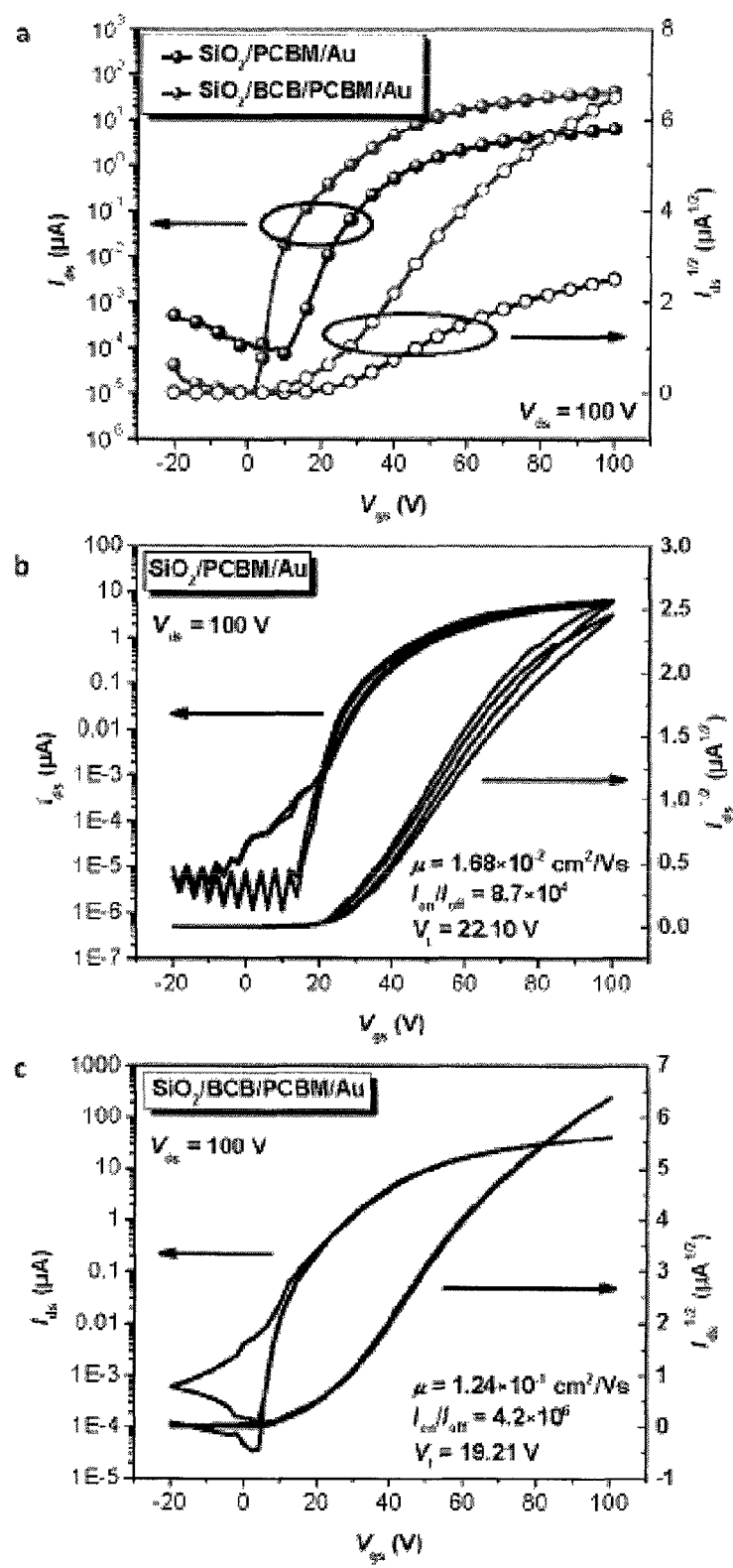
FIG. 3 shows plots of transfer and hysteresis characteristics of transistors, in accordance with other example embodiments.

FIG. 3 shows plots of transfer and hysteresis characteristics of PCBM OTFTs with/without a BCB interlayer (Vds=100 V), measured in an $N_2$ environment ($O_2$, $H_2O$<0.1 ppm), for organic devices in accordance with other example embodiments. The plots are shown for PCBM transistors having a bottom-gate, top-contact configuration, similar to the OTFT transistor shown in FIG. 1E. To facilitate discussion of these embodiments, the following discussion refers back to FIG. 1E.

Gold (Au) is used as source and drain electrodes 140/150 with the dielectric layer 120 including a thin (20 nm) thermal crosslinked BCB layer covered on the surface of a 300 nm thick $SiO_2$ dielectric to passivate the dielectric/semiconductor interface and reduce/eliminate electron charge carrier traps, such as those involving hydroxyl groups. An order of magnitude increase in electron mobility ($\mu=1.24\times10^{-1}$ $cm^2$/Vs) can be obtained using the PCBM with the BCB interlayer (e.g., in $N_2$) as shown in FIG. 3A, as compared with a pristine (e.g., undoped) PCBM device ($\mu=1.68\times10^{-2} cm^2$/Vs). The transistor with BCB also exhibits a threshold voltage Vt of 19.21 V, which is lower than that of a pristine PCBM device (Vt=22.10 V).

FIGS. 3B and 3C respectively show hysteresis characteristics of devices without and with a BCB interlayer, with electron traps at the dielectric/semiconductor interface mitigated via passivation of the hydroxyl-free BCB interlayer. These interlayers can be n-type doped with to obtain solution processable n-channel transistors with high performance and good air stability.

Figure 4:
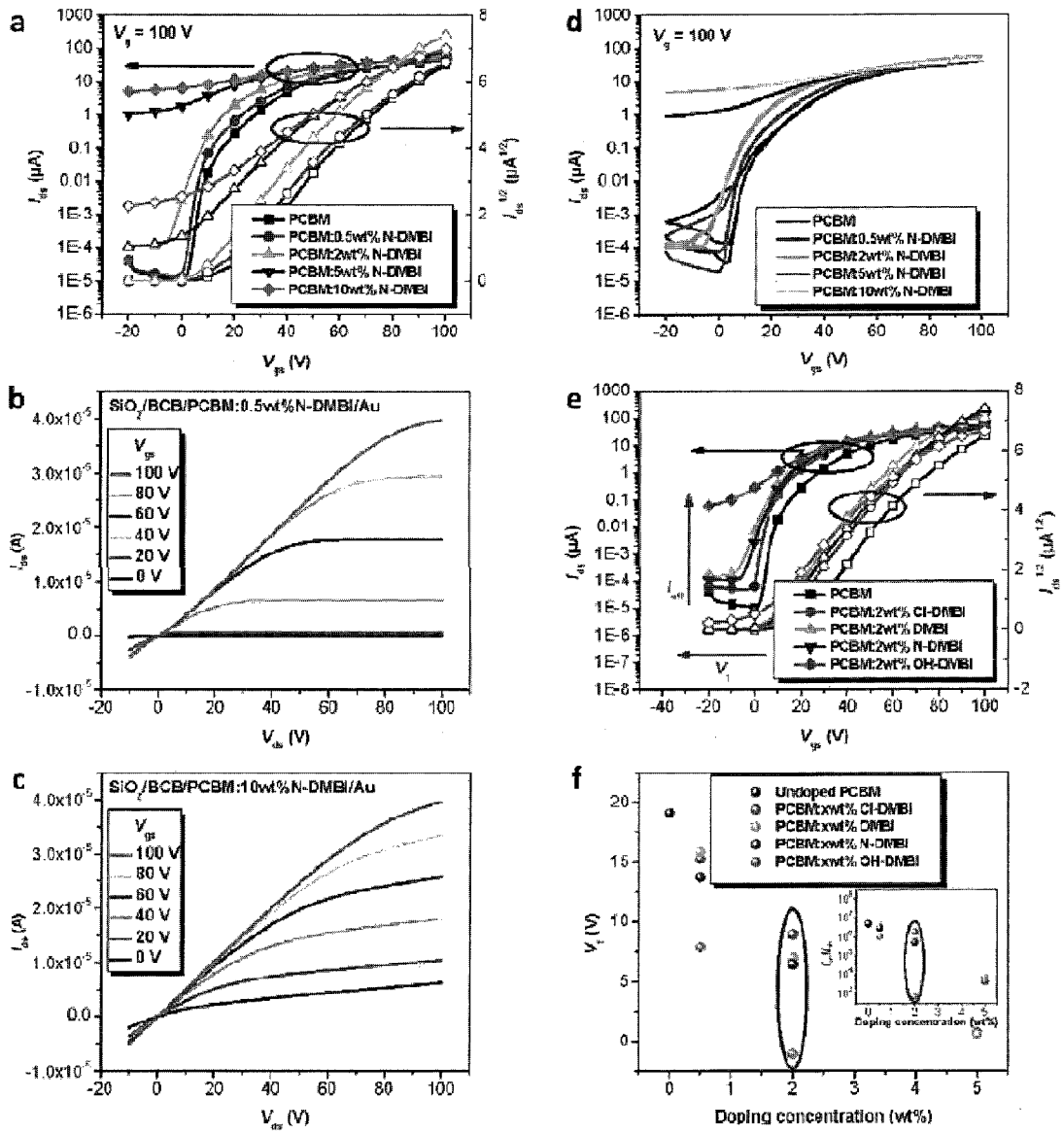
FIG. 4 shows plots of representative transfer, output, hysteresis and doping effect for organic semiconductor devices, in connection with various example embodiments.

FIG. 4 shows plots of representative OTFT transfer, output and hysteresis characteristics of N-DMBI doped PCBM devices, and the n-type doping effect on PCBM transistors with different dopants and at different doping concentrations (as obtained in an $N_2$ environment), in connection with various example embodiments. The plotted characteristics may, for example, be commensurate with the transistors represented in Table 1 below. FIG. 4A shows transfer (Vds=100 V) characteristics of N-DMBI doped PCBM transistors at different doping concentrations. FIG. 4B shows output characteristics of 0.5 wt % N-DMBI-doped PCBM transistors. FIG. 4C shows output characteristics of 10 wt % N-DMBI doped PCBM transistors. FIG. 4D shows hysteresis characteristics of N-DMBI doped PCBM transistors at different doping concentrations. FIG. 4E shows transfer (Vds=100 V) characteristics of doped PCBM transistors with four DMBI derivatives at the doping concentration of 2 wt %. FIG. 4F shows threshold voltages of doped PCBM transistors with four DMBI derivatives at different doping concentrations, with the inset showing on-off ratios of the doped PCBM transistors with four DMBI derivatives at different doping concentrations.

The threshold voltage Vt of transistors can be used to evaluate the gate bias (Vgs) at which electron trap states have been filled and the carriers become mobile. From the transfer characteristics of the doped PCBM transistors, Vt is systematically shifted in negative direction with the increase of the doping concentration for each DMBI dopant, which may be due to the availability of additional mobile electrons obtained after n-type doping. For four DMBI derivatives, the order of the negative shift and the decrease of the on-off ratio is Cl-DMBI<DMBI<N-DMBI<OH-DMBI, which is the same as the trend of HOMO energy levels except OH-DMBI (Cl-DMBI: −4.76 eV, DMBI: −4.73 eV, N-DMBI: −4.67 eV, OH-DMBI: −4.74 eV).

In connection with these embodiments, it has been discovered that the n-type doping strength can be effectively tuned by substituting DMBI derivatives with electron acceptor and donor moieties. At a low doping concentration, the mobilities of doping devices are kept at about 0.1 $cm^2$/Vs, and on-off ratios and Vt decrease relative to undoped devices. At a higher doping concentration of 10 wt %, the doped PCBM devices are nearly conductive such that off currents are higher than about 0.5 µA and on-off ratios are lower than 1000. The 10 wt % OH-DMBI doping transistor exhibits a high off current of about 1.4 µA and a low on-off ratio of about 20. Substantially no hysteresis is exhibited by the doped transistors, even at a high doping concentration.

In an experimental-type embodiment, the doping effect is compared with reported n-type dopants, by fabricating doped PCBM transistors with leucocrystal violet (LCV). Doping effects, such as the negative shift of threshold voltage and the decrease of on-off ratio, are mitigated. The n-type doping effect of OH-DMBI on PCBM transistors may exclude or mitigate contributions to the doping effect via charge carrier injection from contacts on negative shifts, and the decrease of the on-off ratio, (e.g., HOMO levels of OH-DMBI are observed as insignificantly different from that of the other three DMBI derivatives).

Table 1 shows performance characteristics of PCBM transistors fabricated at different doping concentrations using four dopants including different DMBI derivatives and TMBI, as measured in an $N_2$ environment, in connection with various example embodiments. The mobilities at high doping concentrations are not shown (the devices are almost conductive and the on-off ratios are lower than 1000). The data shown represent averages obtained from three or more devices.

TABLE 1

| | Glovebox | | |
|---|---|---|---|
| | $\mu^a$ ($cm^2$/Vs) | $I_{on}/I_{off}$ | $V_t$ (V) |
| PCBM | $1.25 \times 10^{-1}$ | $4.67 \times 10^6$ | 19.10 |
| PCBM: 0.5 wt % Cl-DMBI | $1.27 \times 10^{-1}$ | $3.87 \times 10^6$ | 15.28 |
| PCBM: 2 wt % Cl-DMBI | $1.27 \times 10^{-1}$ | $1.73 \times 10^6$ | 8.95 |
| PCBM: 5 wt % Cl-DMBI | $0.94 \times 10^{-1}$ | $4.00 \times 10^3$ | 0.70 |
| PCBM: 10 wt % Cl-DMBI | / | / | / |
| PCBM: 0.5 wt % DMBI | $1.55 \times 10^{-1}$ | $3.77 \times 10^6$ | 15.82 |
| PCBM: 2 wt % DMBI | $1.57 \times 10^{-1}$ | $5.40 \times 10^5$ | 6.99 |
| PCBM: 5 wt % DMBI | $1.02 \times 10^{-1}$ | $7.20 \times 10^3$ | 0.53 |
| PCBM: 10 wt % DMBI | / | / | / |
| PCBM: 0.5 wt % N-DMBI | $1.18 \times 10^{-1}$ | $2.73 \times 10^6$ | 13.73 |
| PCBM: 2 wt % N-DMBI | $1.02 \times 10^{-1}$ | $4.77 \times 10^5$ | 6.43 |
| PCBM: 5 wt % N-DMBI | / | / | / |
| PCBM: 10 wt % N-DMBI | / | / | / |
| PCBM: 0.5 wt % OH-DMBI | $1.86 \times 10^{-1}$ | $9.73 \times 10^6$ | 7.90 |
| PCBM: 2 wt % OH-DMBI | $1.00 \times 10^{-1}$ | $6.70 \times 10^2$ | −1.03 |
| PCBM: 5 wt % OH-DMBI | / | / | / |
| PCBM: 10 wt % OH-DMBI | / | / | / |
| PCBM: 0.5 wt % TMBI | $1.07 \times 10^{-1}$ | $3.30 \times 10^6$ | 18.31 |
| PCBM: 2 wt % TMBI | $1.22 \times 10^{-1}$ | $5.27 \times 10^6$ | 26.76 |

Doping as discussed herein is carried out using a variety of approaches and mechanisms. In some implementations, the DMBI derivatives are used as precursors for doping, and act as hydrogen transfer reagents to donate hydrogen or hydride with the existence of a reductant, and form radicals with high-lying HOMOs of the dopant material. In connection with these embodiments, it has been discovered that this hydrogen transfer and high energetic radicals can be used to effect strong n-type doping effect of DMBI derivatives.

Other experimental-type embodiments are directed to detecting the doping of organic semiconductor materials as discussed above. By theoretical calculations (Gaussian 03', B3LYP/6-31G*), the HOMO levels of four DMBI radicals are obtained as −3.05 eV of Cl-DMBI, −2.73 eV of DMBI, −2.36 eV of N-DMBI and −2.55 eV of OH-DMBI, which are all high and used to make the electron transfer much easier from the HOMOs of DMBI radicals to the LUMO of PCBM. The order of the HOMO levels is also the same as that of the doping effect on PCBM transistors, except for OH-DMBI. The DMBI cation shows a generally planar configuration (relative to DMBI) after hydrogen transfer and electron transfer, which is used to obtain a stable n-type doping effect.

The doping effect is compared by replacing a 2-position hydrogen at the imidazole core with a methyl group, which is not as easy to be removed as the hydrogen atom. In this context, 1,2,3-trimethyl-2-phenyl-2,3-dihydro-1H-benzoimidazole (TMBI) doped PCBM transistors are fabricated with different doping concentrations, as represented in Table 1. Negative Vt shift and the decreasing on-off ratio n-type doping effects in devices are not observed.

In connection with these experimental embodiments, it has also been discovered that, among the four DMBI dopants, OH-DMBI exhibits a strongest n-type doping effect, although the HOMO levels of molecule and radical are not the highest. Measuring the capacitance-voltage characteristics of Si/SiO$_2$/undoped and doped PCBM/Au metal-insulator-semiconductor (MIS) diodes with DMBI and OH-DMBI, electron densities can be extracted according to the standard Schottky-Mott analysis (see, e.g., references 32-34 below). For undoped PCBM diodes, the electron density is about $3.42 \times 10^{17}/cm^3$. With 10 wt % DMBI doping, the electron density increases about 5 times to $1.43 \times 10^{18}/cm^3$, and with 10 wt % OH-DMBI doping, the electron density increases to $9.02 \times 10^{18}/cm^3$, which is higher than undoped and DMBI-doped PCBM diodes, indicating OH-DMBI can donate more electrons than DMBI even with similar HOMO levels for both neutral molecules and radicals. This doping can be carried out using OH-DMBI as a two-electron-donor in which the hydroxyl group serves as a second hydrogen abstraction source.

Figure 5:
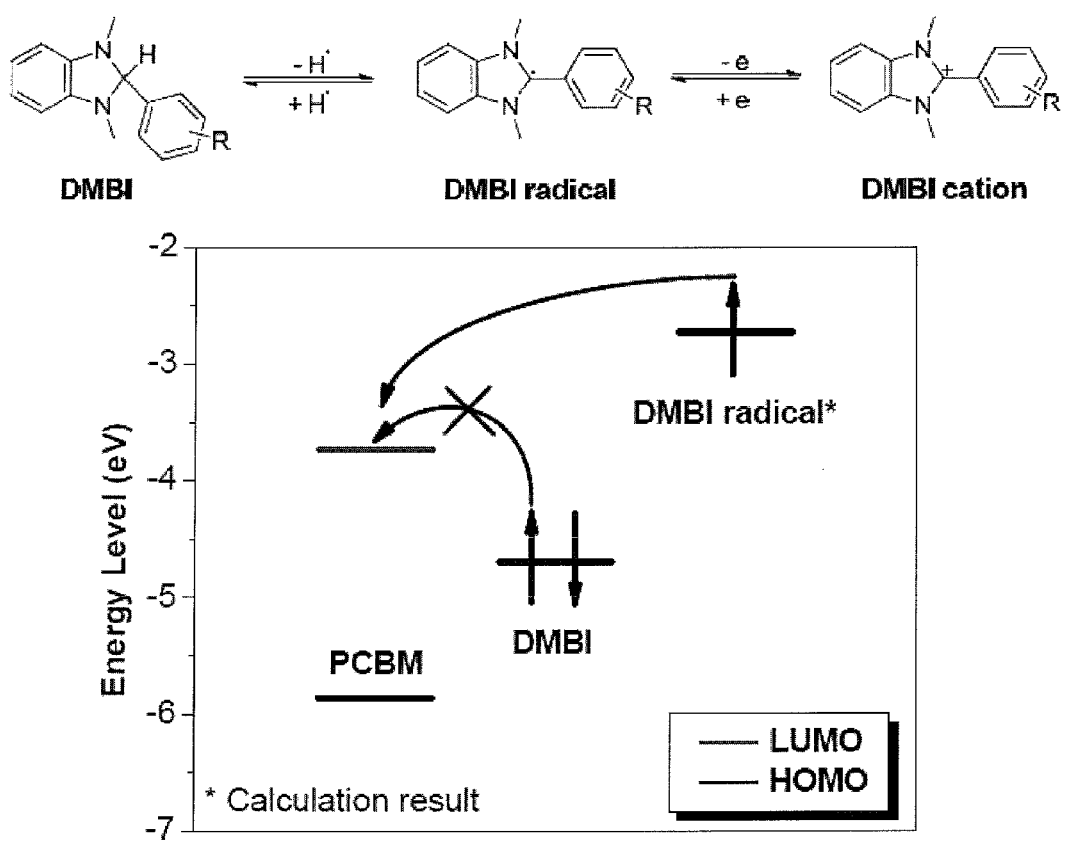
FIG. 5 shows DMBI-based molecules and an energy diagram-plot showing hydrogen transfer and electron transfer for n-type doping with PCBM, DMBI and DMBI radicals, in accordance with other example embodiments.

FIG. 5 shows DMBI-based molecules and an energy diagram-plot showing hydrogen transfer and electron transfer for n-type doping with PCBM, DMBI and DMBI radicals, in accordance with other example embodiments. For a neutral DMBI molecule, the HOMO level is lower than the LUMO of PCBM, so that the electron transfer from DMBI to PCBM is not easy to process. However, after the abstraction of a hydrogen atom, the DMBI radical has a high-lying HOMO level, which is used to facilitate electron transfer. In some embodiments, n-type doping as represented in FIG. 5 and/or otherwise described herein can be used to compensate for electrons trapped by ambient oxidants, leading to an improvement in the air stability of n-channel OTFTs employing such doping/dopants.

Figure 6:
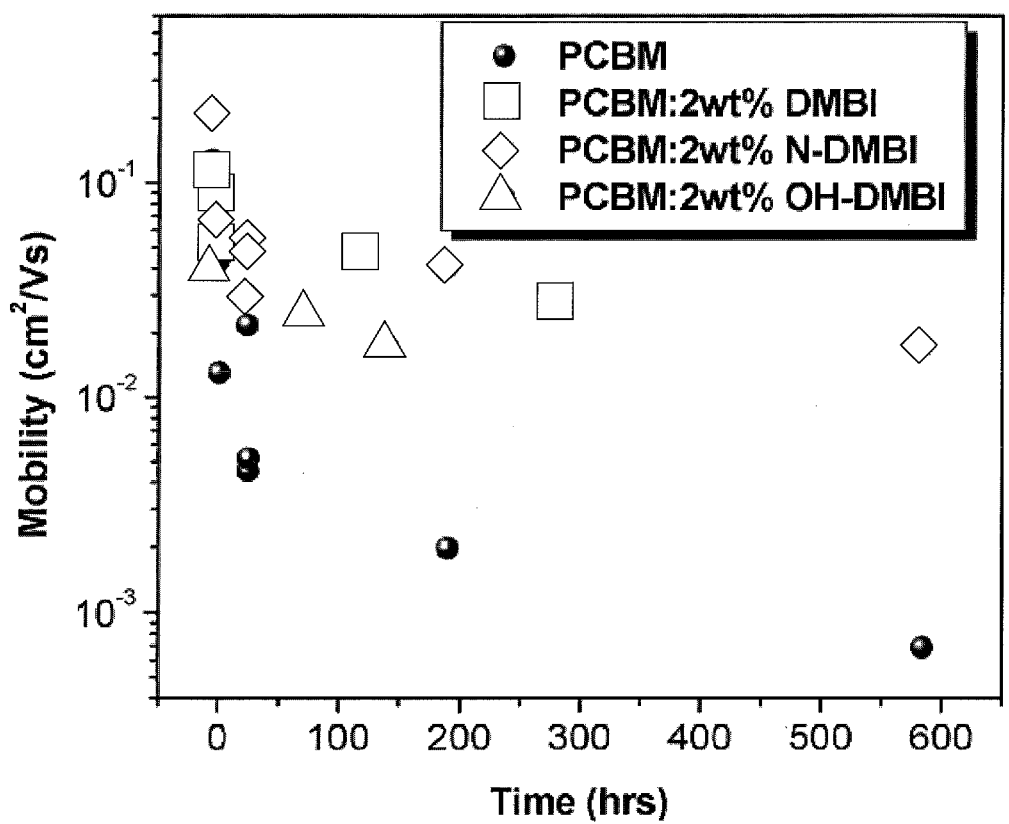
FIG. 6 shows long-term air stabilities of undoped PCBM and DMBI derivative-doped transistors, in accordance with other example embodiments.

FIG. 6 shows long-term air stabilities of undoped PCBM and DMBI derivative-doped transistors, in accordance with other example embodiments. The performance is plotted as a function of time for transistors respectively employing DMBI, N-DMBI and OH-DMBI dopants at 2 wt %, as well as undoped PCBM. For the undoped PCBM, the performance degrades quickly, though the interface of dielectric/semiconductor may already passivated by a thin hydroxyl-free BCB layer. Operation of the PCBM transistor without BCB passivation can result in termination of device functionality in about 5 minutes after exposure to air, which may be due to rapid electron charge trapping by ambient oxidants (e.g., due to the high-lying LUMO level of PCBM). Doping with n-type DMBI derivatives improves the air stability and maintains the mobility (e.g., higher than $10^{-2} cm^2/Vs$, which renders the doping approach amenable for use with air sensitive n-channel semiconductors).

Figure 7:
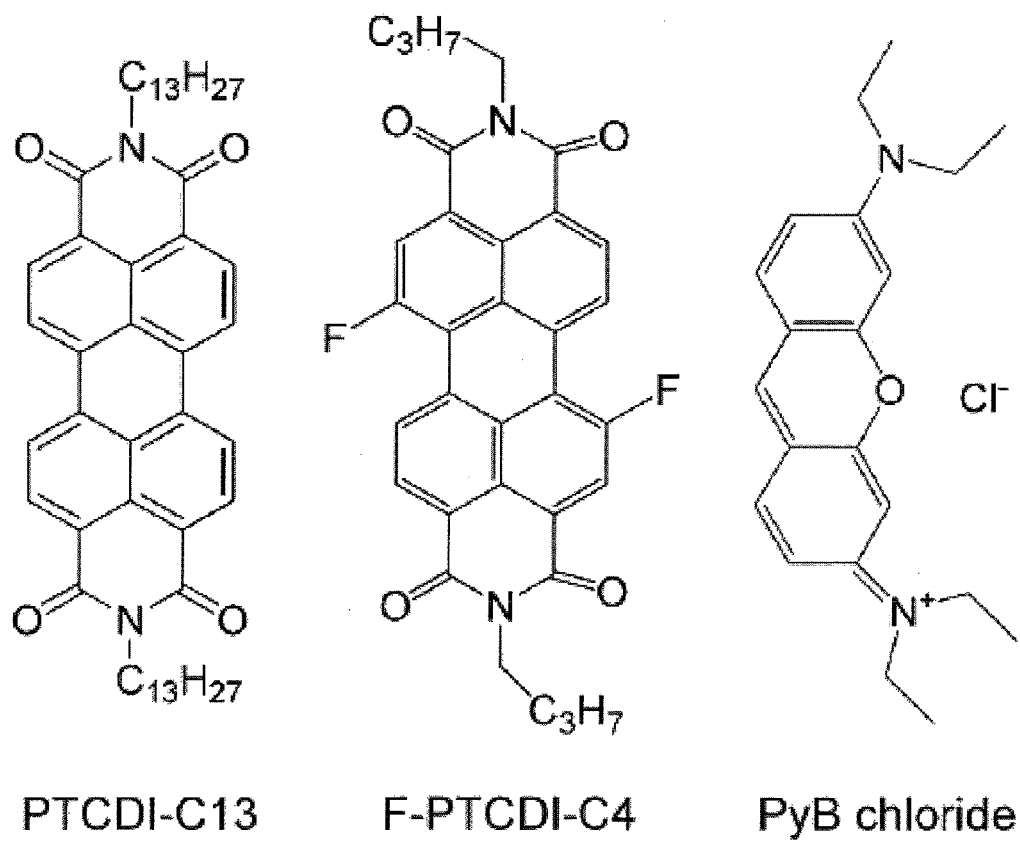
FIG. 7 shows chemical structures of dopants and semiconductor materials used to produce organic electronic devices, according to one or more example embodiments.

FIG. 7 shows chemical structures of dopants and semiconductor materials used to produce organic electronic devices, according to one or more example embodiments. The structures shown include PTCDI-C13, F-PTCDI-C4, and PyB chloride. The PyB chloride is used to dope an organic material including one or both of the PTCDI-C13, F-PTCDI-C4 semiconductor materials. The doped materials are rendered resistive to oxidation upon exposure to ambient conditions (e.g., air), relative to the susceptibility of the respective semiconductor materials to oxidation in their respective undoped (e.g., pristine) states.

In some embodiments, the materials shown in FIG. 7 are used as follows. The PTCDI-C13 and F-PTCDIC4 materials are purified by gradient sublimation and used to form TFT devices with bottom-gate top-contact configuration are prepared on highly doped n-type Silicon wafers as a gate electrode with a thermally grown SiO$_2$ (300 nm, capacitance Ci=10 nFcm$^{-2}$) dielectric. The SiO$_2$ surface is treated with n-octadecyl triethoxysilane ($C_{18}H_{37}Si(OC_2H_5)_3$; OTS). For bulk doping, active layers (45 nm) with different doping ratios are vacuum-deposited by co-evaporation at a substrate temperature (T$_D$) of about 110° C. The evaporating rates of the semiconductor and the dopant are monitored, and a 5-nm-thick PyB layer is deposited onto OTS-treated SiO$_2$, and a 45-nm-thick PTCDI layer is deposited on the PyB layer. Source and drain electrodes (e.g., Au, to form a channel length and width of 50 μm and 1 mm) are thermally evaporated through a shadow mask.

Figure 8:
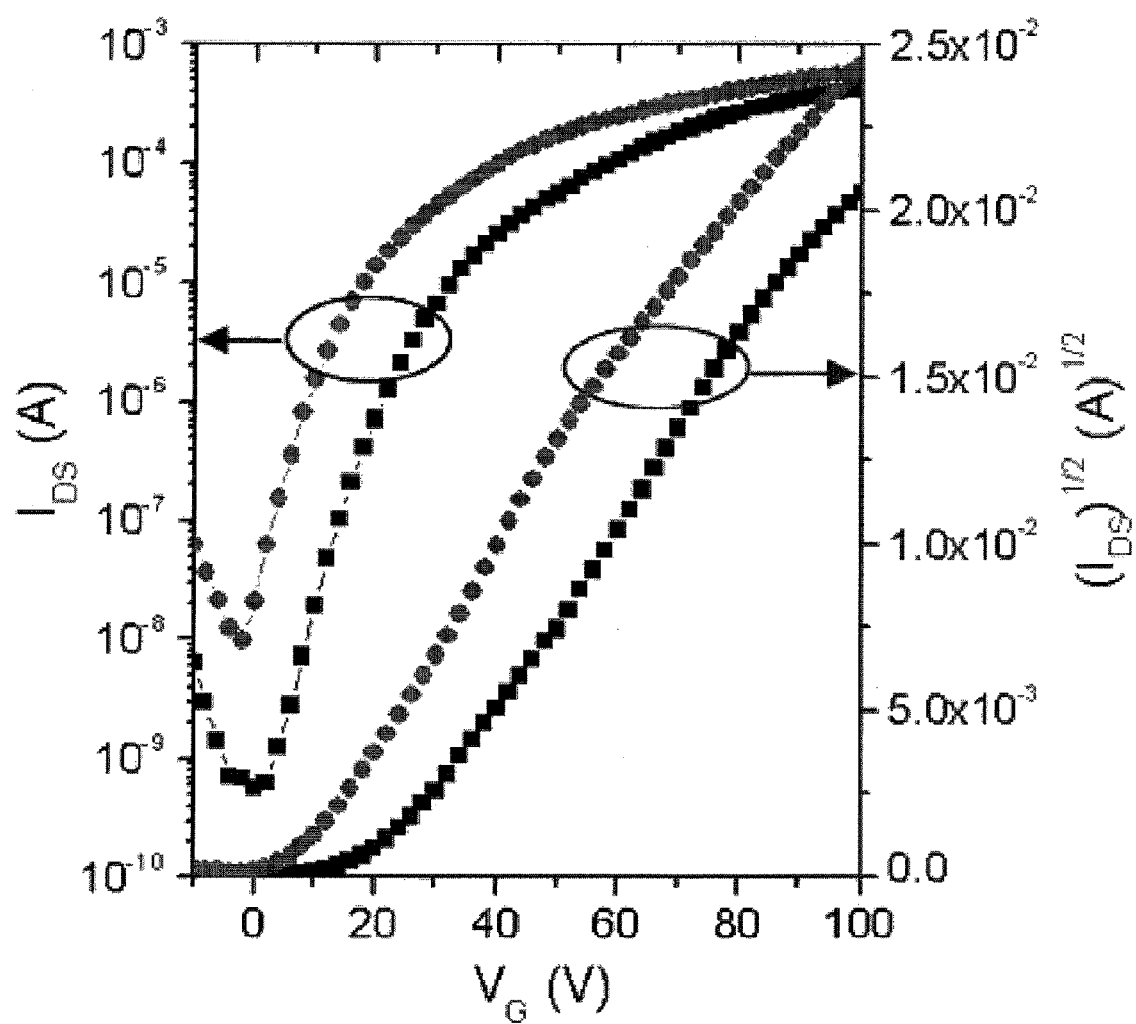
FIG. 8 shows plots of current-voltage characteristics for organic devices, in accordance with another example embodiment.

FIG. 8 shows plots of current-voltage characteristics for PyB-doped PTCDI-C13 TFTs with a PTCDI-C13/PyB molar ratio of 42/1, in accordance with another example embodiment. The circles and squares respectively correspond to transfer characteristics (V$_{DS}$=+100 V) measured in nitrogen atmosphere and in air (1 h exposure), respectively. In connection with this embodiment, and while the n-type behavior of pristine PTCDI-C13 TFTs is very unstable in air, it has been discovered that PyB-doped PTCDI-C 13 TFTs can be operated in air, with substantially similar field-effect mobilities (μ) and higher on/off current ratios (I$_{on}$/I$_{off}$), relative to operation in an inert environment, such as in an N$_2$ atmosphere.

Figure 9:
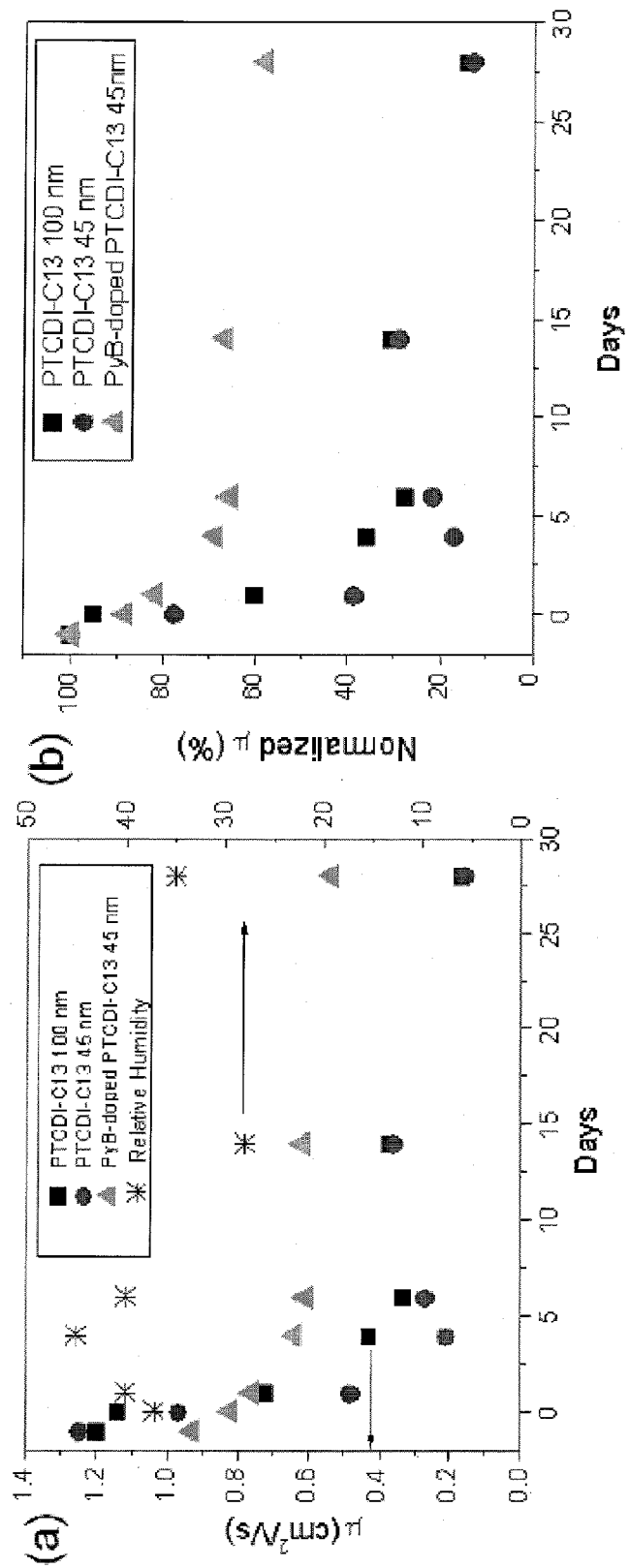
FIG. 9 shows plots of the air-stability of organic devices, in accordance with other example embodiments.

FIG. 9 shows plots of the air-stability of PyB-doped and pristine PTCDI-C 13 TFTs with different active layer thicknesses, as monitored by measuring the performance as functions of time, in accordance with other example embodiments. The molar ratio of PTCDI-C13/PyB is 42/1 in the doped devices. FIG. 9A shows variations of field-effect mobilities of pristine PTCDI-C13 TFTs with 100 nm and 45 nm thicknesses and PyBdoped 45-nm-thick PTCDI-C13 TFTs as functions of time. FIG. 9B shows the normalized field-effect mobilities for the pristine and doped devices. In connection with these embodiments and related discoveries, while the performance of the pristine PTCDI-C13 TFTs rapidly degrades, the doped TFTs maintain desirable performance over time. In addition, the 100 nm-thick PTCDI-C13 TFTs show slower degradation for about one week, relative to 45-nm-thick PTCDI-C 13 TFTs, but exhibit similar degradation afterwards.

Figure 10:
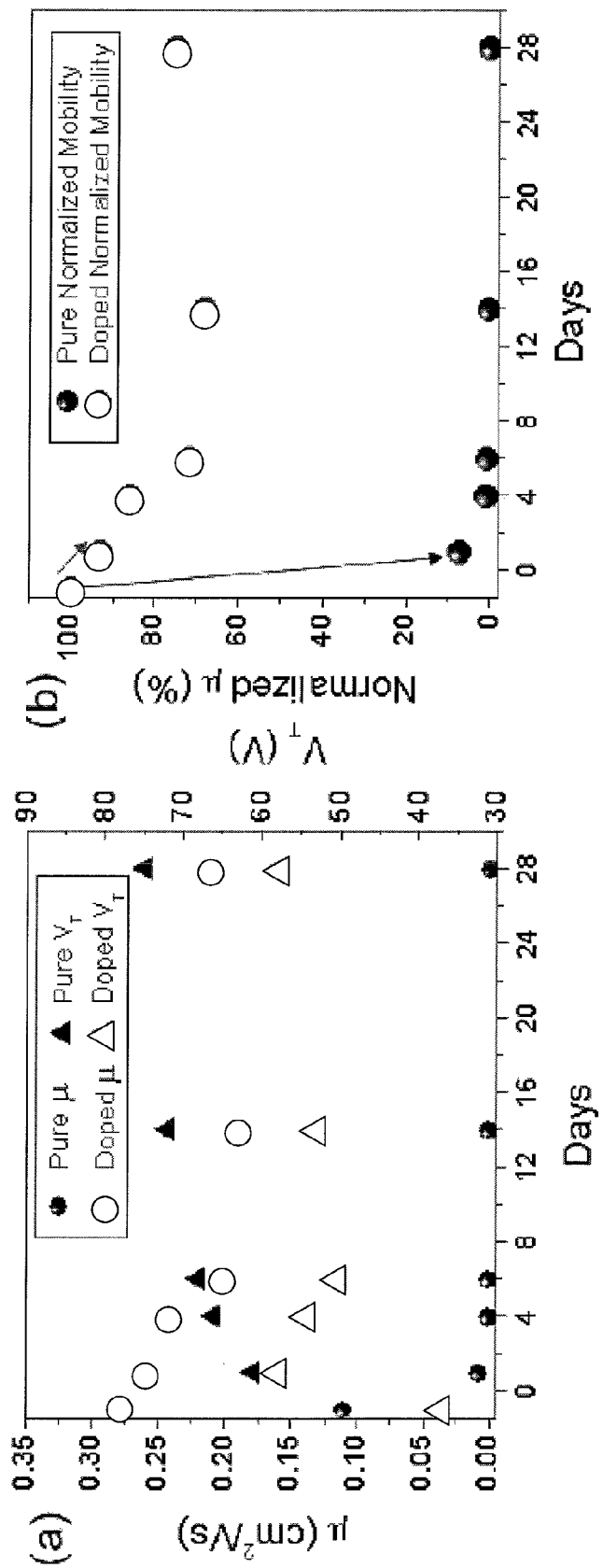
FIG. 10 shows plots of air-stability measurements of organic devices in pristine and doped conditions, in accordance with other example embodiments.

FIG. 10 shows plots of air-stability measurements of F-PTCDI-C4 TFTs in pristine and doped (molar ratio of F-PTCDI-C4/PyB 42/1) conditions, in accordance with other example embodiments. FIG. 10A shows variations of field-effect mobilities and threshold voltages of pristine and PyB-doped F-PTCDI-C4 TFTs as functions of time. FIG. 10B shows normalized field-effect mobilities for pristine and PyB-doped F-PTCDI-C4 TFTs. The F-PTCDIC4 TFTs are rendered more stable in air after n-doping by PyB.

While FIGS. 7-10 and related embodiments discuss doping PTCDI-C13 and F-PTCDI-C4 materials, these materials are described by way of example, and other materials may be similarly doped. For example, other materials having LUMO levels that are above the empirical onset region (−3.8~−4.0 eV) for air-stability of arylene diimide-based n-channel OTFTs can be used (e.g., where such materials are susceptible to oxidation or other undesirable conditions, absent doping).

In other example embodiments, energetic barriers for n-doping of channel regions of organic materials such as PTCDI derivatives with a dopant such as PyB are overcome using a positively-applied gate field. This field application is used to engender additional negative charge carriers in the channel area and lowers the energetic barriers for doping.

Various embodiments described above and shown in the figures may be implemented together and/or in other manners. One or more of the items depicted in the drawings/figures can also be implemented in a more separated or integrated manner, or removed and/or rendered as inoperable in certain cases, as is useful in accordance with particular applications. For example, embodiments involving the doping of organic semiconductors as discussed above may be implemented using different/additional dopants or solution materials, and with different types of substrates. In view of the description herein, those skilled in the art will recognize that many changes may be made thereto without departing from the spirit and scope of the present invention.

What is claimed is:

1. A method for manufacturing an organic electronic device having adjacent organic semiconductor regions, including a first region and a second region and having a semiconductor junction therebetween at which the first and second regions interact on electron charge carriers in response to a threshold voltage, the method comprising:
   providing an organic material that is susceptible to decreased mobility due to trapping of electron charge carriers in response to exposure to air; and
   providing an n-type dopant and doping the first region with the organic material that, when combined with the organic material via doping, effects air stability for the organic electronic device by setting the threshold voltage at a level that increases conductivity of the device as attributable to the doping.

2. The method of claim 1, further including selecting the organic material with a LUMO level of at least −3.7 eV, and exposing the doped first region of organic material or the device to air.

3. The method of claim 1, wherein providing an organic material includes selecting the organic material and the n-type dopant that, when combined, provide a doped organic material that exhibits mobility upon exposure of the device to air that is substantially similar to a mobility exhibited by the doped organic material upon exposure to at least one of an inert gas environment and a vacuum environment, and wherein the step of doping provides means for increasing the conductivity of the device.

4. The method of claim 1, wherein providing an organic material that is susceptible to decreased mobility due to the trapping of electron charge carriers includes providing an organic material that is susceptible to decreased mobility due to at least one of impurities being present in the organic material and oxidation of the organic material and wherein the conductivity increases by an order of magnitude.

5. The method of claim 1, wherein providing an organic material includes providing an organic material having a LUMO level that is above at least one of −4.1 eV, −4.0 eV, and −3.7 eV, depending on the kinetic factors in a thin film of the organic electronic device.

6. The method of claim 1, wherein providing an organic material includes providing an organic material having a LUMO level that is above an empirical onset region of between about −3.8 to −4.0 eV for air-stability of arylene diimide-based n-channel organic materials.

7. The method of claim 1, wherein doping the organic material includes applying an electric field to the dopant and organic material to engender negative charge in the channelarea, lower the energetic barrier of the organic material, and effect doping of the organic material with the n-type dopant.

8. The method of claim 1, wherein doping the organic material includes controlling the transfer of electrons from highest occupied molecular orbitals, or singly occupied molecular orbitals, of the first region of dopant material to LUMOs of the organic material via n-type doping, the density of mobile electron charge in the first region being increased and therein compensating for the trapping of electron charge carriers.

9. The method of claim 1, wherein doping the organic material includes at least one of: co-evaporating the n-type dopant and the organic material onto a substrate; depositing an organic material onto a substrate and a layer of the n-type dopant; and depositing an organic material either on a layer of the n-type dopant or below a layer of the n-type dopant.

10. The method of claim 1,
    wherein providing an organic material and doping the organic material includes providing a mixture of an organic material and a dopant on an underlying substrate, using the dopant in the mixture to dope the organic material, and
    further including using the mixture to form a layer of doped organic material on the substrate.

11. The method of claim 1, wherein providing an organic material and doping the organic material includes forming a single layer of the doped organic material in contact with the organic material layer, and further providing at least one other material layer of the organic electronic device, wherein the single layer of the doped organic material is between the organic material layer and said at least one other material layer.

12. The method of claim 1, wherein providing an organic material and doping the organic material includes forming a monolayer of the doped organic material on a substrate to form a channel region of the organic electronic device, and wherein the conductivity increases by multiple orders of magnitude.

13. The method of claim 1, wherein the doping includes vacuum depositing with an n-type dopant to dope and set electric characteristics of material in the organic electronic device.

14. The method of claim 1, wherein the doping includes using solution-processed doping with an n-type dopant to dope and set electric characteristics of material in the organic electronic device.

15. A method for manufacturing an organic semiconductor device, the method comprising:
    providing an organic semiconductor material that is susceptible to decreased mobility due to the trapping of electron charge carriers in response to exposure to air, the organic semiconductor material having a LUMO level that is at least −4.1 eV;
    selecting an n-type dopant that, when used to dope the organic semiconductor material, effects air stability for the device having doped organic semiconductor material to provide material means for increasing conductivity of the device by the respective organic semiconductor material and the n-type dopant having respective electron affinity and ionization potential values that exhibit an energetic barrier to doping of the organic semiconductor material; and applying a field to the organic material to generate negative charge carriers in the organic semiconductor material to overcome the energetic barrier and facilitate doping of the organic semiconductor material with the n-type dopant.

16. An organic electronic device comprising:

an organic material that is susceptible to decreased mobility due to the trapping of electron charge carriers in response to exposure to air; and in the organic material, an n-type dopant that, when combined with the organic material via doping, effects air stability for the doped organic material, and wherein the n-type dopant combined with the organic material via doping manifests material means for increasing conductivity of the device.

17. The device of claim 16, wherein the organic device includes an organic thin film transistor, and wherein the doped organic material is a channel region of the transistor.

18. The device of claim 16, wherein the organic device includes an organic optical device, and wherein the doped organic material is an active region of the optical device.

19. The device of claim 16, wherein the doped organic material is a monolayer of the organic electronic device.

20. The device of claim 16, wherein the doped organic material is configured to exhibit mobility upon exposure to air after 10 days without encapsulation that substantially retains at least 40% of the mobility exhibited by the doped organic material to at least one of an inert gas environment and a vacuum environment.

21. The device of claim 16, wherein the organic material is susceptible to decreased mobility due to at least one of impurities being present in the organic material and oxidation of the organic material.

22. The device of claim 16, wherein the organic material has a LUMO level that is above at least one of $-4.1$ eV, $-4.0$ eV, and $-3.7$ eV, depending on kinetic factors in a thin film of the organic electronic device.

* * * * *